(12) United States Patent
Shimbo et al.

(10) Patent No.: US 9,343,461 B2
(45) Date of Patent: May 17, 2016

(54) SEMICONDUCTOR DEVICE INCLUDING A LOCAL WIRING CONNECTING DIFFUSION REGIONS

(71) Applicant: PANASONIC CORPORATION, Oaza Kadoma, Kadoma-shi, Osaka (JP)

(72) Inventors: Hiroyuki Shimbo, Kyoto (JP); Masaki Tamaru, Kyoto (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 14/489,188

(22) Filed: Sep. 17, 2014

(65) Prior Publication Data

US 2015/0014781 A1  Jan. 15, 2015

Related U.S. Application Data

(63) Continuation of application No. PCT/JP2013/002675, filed on Apr. 22, 2013.

(30) Foreign Application Priority Data

Apr. 24, 2012  (JP) .................................. 2012-098434

(51) Int. Cl.
*H01L 27/092* (2006.01)
*H01L 21/8238* (2006.01)
(Continued)

(52) U.S. Cl.
CPC .... *H01L 27/0928* (2013.01); *H01L 21/823871* (2013.01); *H01L 23/5386* (2013.01); *H01L 27/0207* (2013.01); *H01L 29/4232* (2013.01); *H01L 2924/0002* (2013.01)

(58) Field of Classification Search
CPC ............ H01L 27/0928; H01L 23/5386; H01L 29/4232; H01L 21/823871; H01L 27/0207
See application file for complete search history.

(56) References Cited

U.S. PATENT DOCUMENTS 7,737,472 B2 * 6/2010 Kondo .............. H01L 27/11807
257/204
8,363,456 B2 * 1/2013 Nii ................................ 365/156
(Continued)

FOREIGN PATENT DOCUMENTS

JP  55-115357 A  9/1980
JP  02-283057 A  11/1990
(Continued)

OTHER PUBLICATIONS

International Search Report issued in International Application No. PCT/JP2013/002675 mailed Jul. 23, 2013, with English translation.

*Primary Examiner* — William Coleman
(74) *Attorney, Agent, or Firm* — McDermott Will & Emery LLP

(57) ABSTRACT

A semiconductor device has first conductivity type regions extending in a first direction, and second conductivity type regions extending in the first direction. The first conductivity type regions and the second conductivity type regions are alternately arranged in a second direction perpendicular to the first direction. The semiconductor device includes a first impurity diffused regions formed in the first conductivity type regions, a first local wiring connected to the first conductivity type regions, and extending in the second direction, a first potential supply wiring formed above the first local wiring, and extending in the first direction, and a first contact hole for connecting the first local wiring to the first potential supply wiring.

20 Claims, 6 Drawing Sheets

(51) Int. Cl.
*H01L 27/02* (2006.01)
*H01L 23/538* (2006.01)
*H01L 29/423* (2006.01)

(56) References Cited

U.S. PATENT DOCUMENTS

| | | | |
|---|---|---|---|
| 8,648,392 B2* | 2/2014 | Nishimura | H01L 27/0207 257/206 |
| 8,957,459 B2* | 2/2015 | Morimoto et al. | 257/206 |
| 2002/0105049 A1 | 8/2002 | Barney et al. | |
| 2012/0168875 A1 | 7/2012 | Tamaru et al. | |
| 2012/0306101 A1 | 12/2012 | Tamaru | |
| 2013/0113112 A1 | 5/2013 | Tamaru | |
| 2014/0159160 A1 | 6/2014 | Tamaru et al. | |

FOREIGN PATENT DOCUMENTS

| | | |
|---|---|---|
| JP | 2002-334933 A | 11/2002 |
| JP | 2008-300765 A | 12/2008 |
| JP | 2011-210876 A | 10/2011 |
| WO | 2011/077664 A1 | 6/2011 |
| WO | 2012/056615 A1 | 5/2012 |

* cited by examiner

| N-type well | Impurity diffused region | Gate electrode | Potential supply wiring |
| P-type well | Dummy gate | Local wiring | Contact hole |

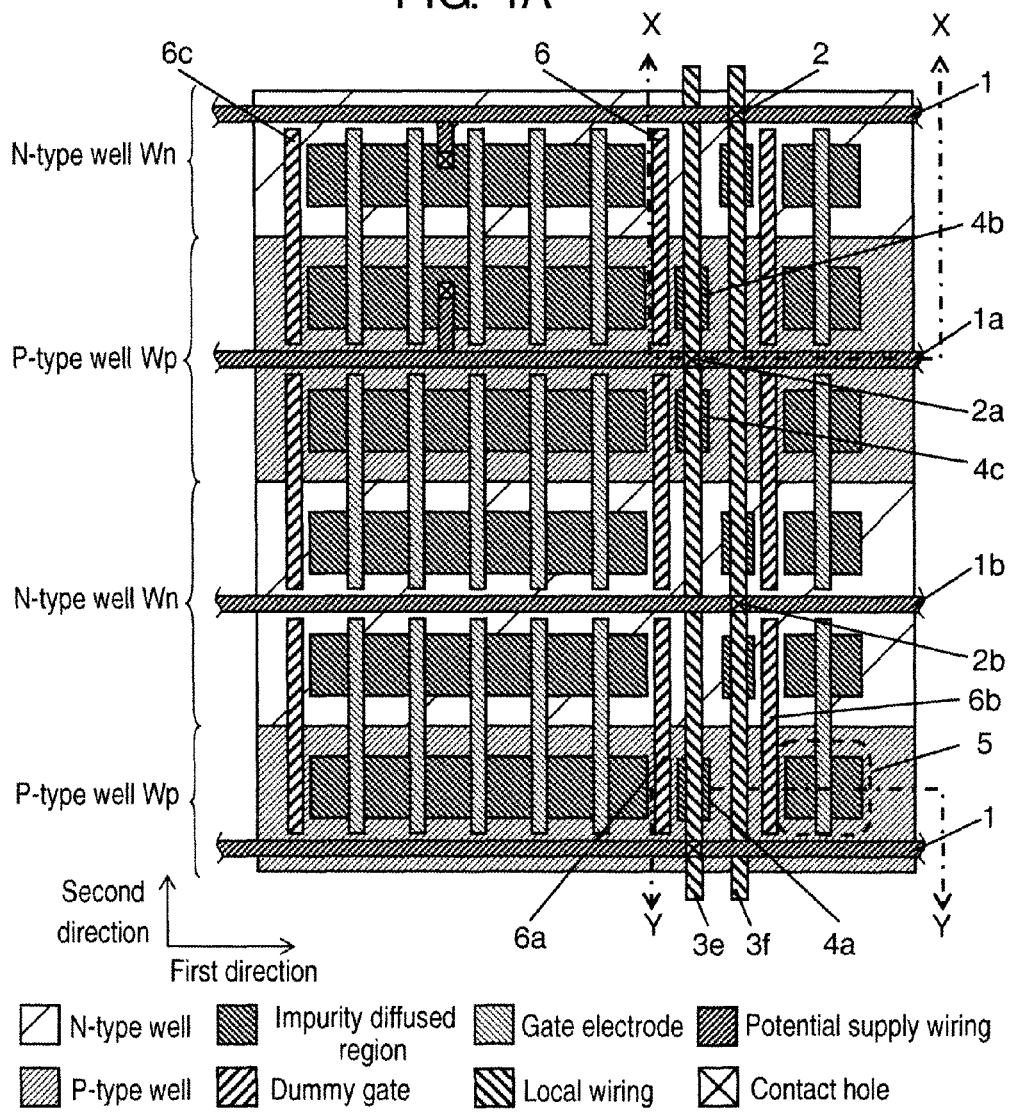
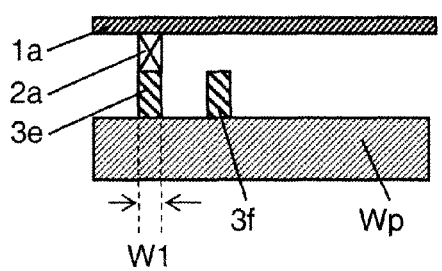
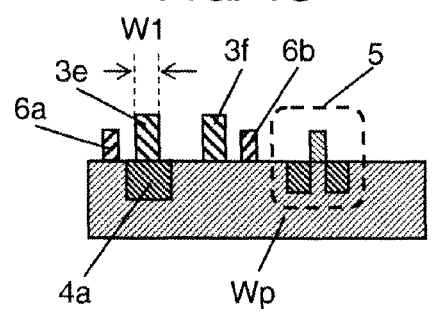
FIG. 4A
FIG. 4B
FIG. 4C

| N-type well | Impurity diffused region | Gate electrode | Potential supply wiring |
| P-type well | Dummy gate | Local wiring | Contact hole |

SEMICONDUCTOR DEVICE INCLUDING A LOCAL WIRING CONNECTING DIFFUSION REGIONS

This is a continuation of International Application No. PCT/JP2013/002675, with an international filing date of Apr. 22, 2013, which claims priority of Japanese Patent Application No. 2012-098434, filed on Apr. 24, 2012, the contents of each of which are hereby incorporated by reference.

BACKGROUND

1. Technical Field

The present disclosure relates to a layout of a semiconductor device, and more particularly to a semiconductor device capable of achieving increased speed and increased degree of integration.

2. Description of the Related Art

According to a conventional semiconductor device, a transistor is formed in each of an N-type well region and a P-type well region that are formed so as to extend in a horizontal direction, and the N-type well regions and the P-type well regions are alternately arranged in a vertical direction. The above structure is known as a standard cell structure in general.

According to the conventional standard cell structure (see, for example, Unexamined Japanese Patent Publication No. 2008-300765), a power supply is supplied to the transistor in each unit cell, through a power supply wiring extending in the vertical direction and a power supply wiring extending in the horizontal direction. That is, according to the conventional standard cell structure, a potential is supplied to a substrate of the cell, through two metal wiring layers that are also used for to a signal wiring. Thus, the conventional standard cell structure has severe design restrictions on arrangement of the signal wiring.

According to the conventional standard cell structure (see, for example, Unexamined Japanese Patent Publication No. 2002-334933), a specific cell (hereinafter, referred to as the tap cell) is separately prepared to supply a substrate power supply to cells in a cell row, and the power supply is supplied from the specific cell to a substrate (well region) of the transistor.

SUMMARY

However, the conventional semiconductor device includes the semiconductor device in which the power supply is supplied to the cell, through two metal wiring layers (the power supply wiring in the vertical direction and the power supply wiring in the horizontal direction) that are also used to the signal wiring. According to this semiconductor device, a wiring resource of the signal wiring is reduced. As a result, the problem is that a chip area is increased.

In addition, according to the conventional tap cell, the substrate power supply is supplied from the power supply wiring through a contact hole. According to the above conventional tap cell, the problem is that in a case where the contact hole is defectively formed, resistance of the contact hole is increased or an open failure is generated. In order to avoid the above problems, the number of the contact holes is to be increased, but when the number of the contact holes is increased, the problem is that an area of the semiconductor device is increased.

In view of the above problems, an object of the present disclosure is to provide a semiconductor device capable of ensuring a wiring resource, and surely supplying a power supply to a substrate without increasing an area.

A semiconductor device according to one aspect of the present disclosure has a plurality of first conductivity type regions extending in a first direction, and a plurality of second conductivity type regions extending in the first direction, and the plurality of first conductivity type regions and the plurality of second conductivity type regions are arranged such that the first conductivity type regions and the second conductivity type regions are alternately arranged in a second direction perpendicular to the first direction. Furthermore, the semiconductor device includes a plurality of first impurity diffused regions formed in the plurality of first conductivity type regions, a first local wiring connected to the plurality of first conductivity type regions, and extending in the second direction, a first potential supply wiring formed above the first local wiring, and extending in the first direction, and a first contact hole for connecting the first local wiring to the first potential supply wiring.

According to the present disclosure, it is possible to ensure the wiring resource, and supply the power supply to the substrate without increasing the area.

BRIEF DESCRIPTION OF THE DRAWINGS

FIG. 4A is a plan view showing a layout structure of a semiconductor device according to a third exemplary embodiment.

FIG. 4B is a cross-sectional view taken along a line X-X in FIG. 4A.

FIG. 4C is a cross-sectional view taken along a line Y-Y in FIG. 4A.

DETAILED DESCRIPTION OF THE PREFERRED EMBODIMENTS

First Exemplary Embodiment

Hereinafter, exemplary embodiments of the present disclosure will be described with reference to the drawings.

Figure 1A:
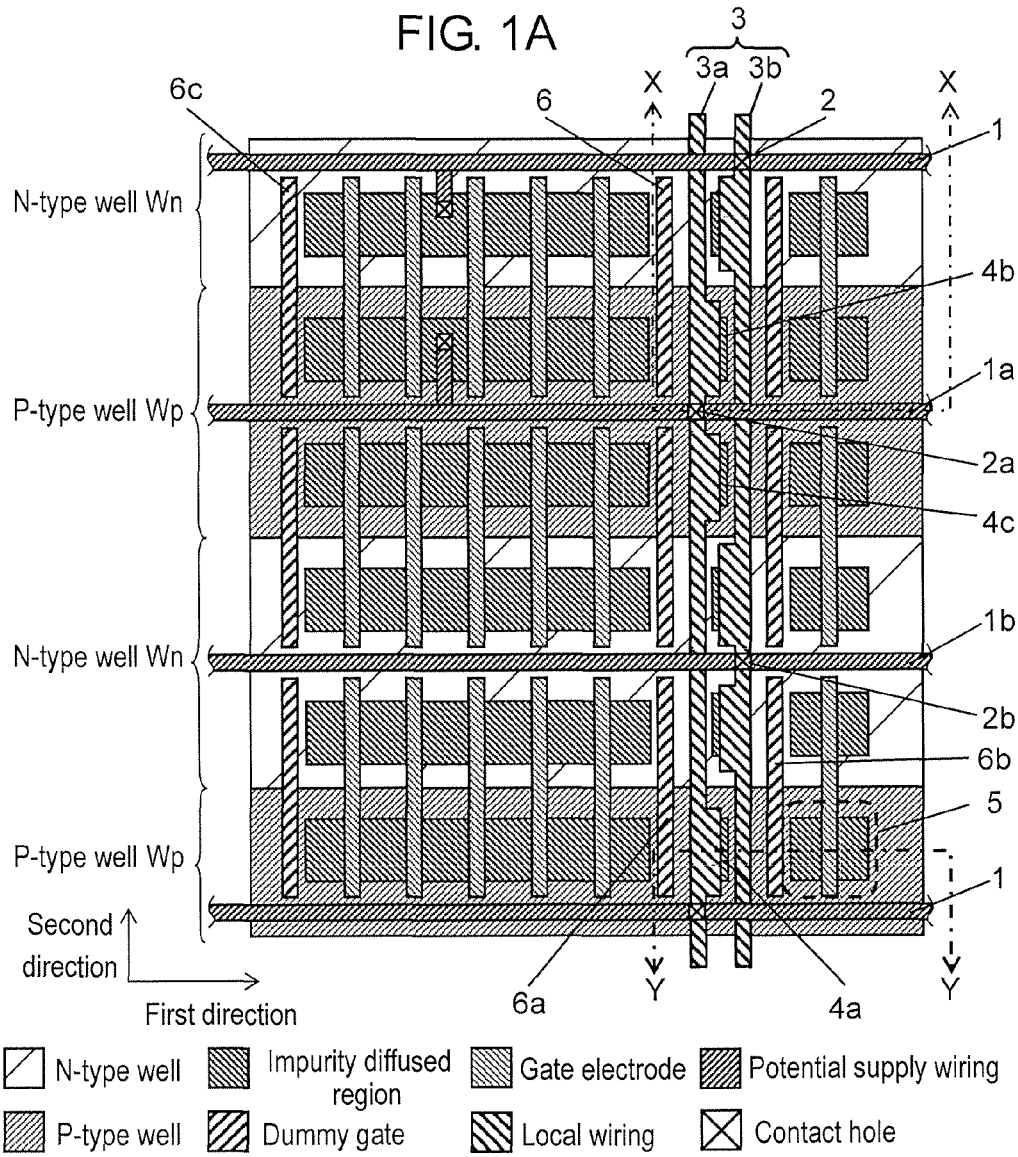
FIG. 1A is a plan view showing a layout structure of a semiconductor device according to a first exemplary embodiment.
Figure 1B:
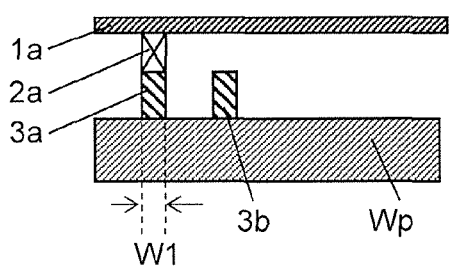
FIG. 1B is a cross-sectional view taken along a line X-X in FIG. 1A.
Figure 1C:
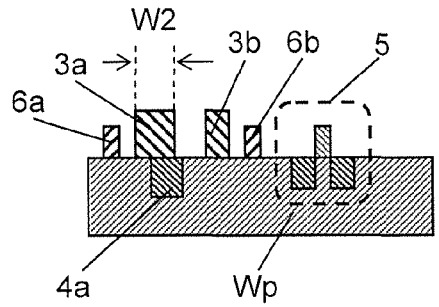
FIG. 1C is a cross-sectional view taken along a line Y-Y in FIG. 1A.

FIGS. 1A to 1C are views each showing a structure of a semiconductor device according to the first exemplary embodiment. FIG. 1A is a plan view showing a layout structure, FIG. 1B is a cross-sectional view taken along a line X-X in FIG. 1A, and FIG. 1C is a cross-sectional view taken along a line Y-Y in FIG. 1A.

Hereinafter, the semiconductor device according to the first exemplary embodiment will be described with reference to FIGS. 1A to 1C. As shown in FIG. 1A, each of N-type well Wn and P-type well Wp is formed so as to extend in a horizontal direction (first direction). In addition, N-type wells Wn and P-type wells Wp are alternately and repeatedly arranged in a vertical direction (second direction).

Each well region includes an impurity diffused region and a gate electrode to form a transistor. In addition, dummy gate 6 is formed adjacent to the transistor. Furthermore, potential supply wiring 1 is formed so as to extend in the first direction to supply a potential to the transistor formed in the well region. For example, potential supply wiring 1a is formed above P-type well Wp and extends in the first direction to supply a power supply (VDD) to the impurity diffused region. In addition, potential supply wiring 1b is formed above N-type well Wn and extends in the first direction to supply a ground potential (VSS) to the impurity diffused region.

Local wiring 3 extends in the vertical direction (second direction), and local wiring 3 is arranged under potential supply wiring 1. Potential supply wiring 1 and local wiring 3 are connected through contact hole 2. For example, potential supply wiring 1a and local wiring 3a are connected through contact hole 2a. In addition, potential supply wiring 1b and local wiring 3b are connected through contact hole 2b.

Furthermore, actually, the semiconductor device includes a wiring layer on which potential supply wiring 1 is arranged, and above this wiring layer, a source and a drain wirings of each transistor, and a signal wiring provided between the transistors, but they are not shown in FIG. 1A.

Next, the first exemplary embodiment will be described with reference to FIGS. 1B and 1C. In addition, a similar component is marked with the same reference and its description is omitted.

As shown in FIG. 1B, local wirings 3a and 3b are arranged on P-type well Wp. Local wiring 3a is connected to potential supply wiring 1a through contact hole 2a. Local wiring 3b is not connected to potential supply wiring 1a in the P-type well region. Local wiring 3a in a region connected to contact hole 2 has a wiring width of W1.

Furthermore, as shown in FIG. 1C, local wirings 3a and 3b are arranged on P-type well Wp, and dummy gates 6a and 6b are arranged adjacent to and parallel to local wirings 3a and 3b. Furthermore, transistor 5 is formed adjacent to dummy gate 6b. Impurity diffused region 4a is provided under local wiring 3a, and impurity diffused region 4a is formed by injecting a P-type impurity that has the same polarity as P-type well Wp. In this configuration, a potential can be supplied from local wiring 3a to a substrate (P-type well Wp) of transistor 5 through impurity diffused region 4a.

Local wiring 3a has a wiring width of W2 (W2>W1) in a region where local wiring 3a is in contact with impurity diffused region 4a, and this wiring width is larger than the wiring width of local wiring 3a in the other regions. Thus, since the width of the local wiring is larger in a region above impurity diffused region 4a used for supplying the substrate potential, than that in the other regions, local wiring 3a can be more surely connected to impurity diffused region 4a.

According to the first exemplary embodiment, the potential is supplied to the substrate of the transistor, through impurity diffused region 4, local wiring 3 directly connected thereto, and potential supply wiring 1. In this configuration, only one potential supply wiring 1 is used as the metal wiring layer to supply the substrate potential. Therefore, while the two metal wiring layers have been conventionally needed to supply the potential to the substrate, only the one metal wiring layer is used in this exemplary embodiment, so that a resource of the metal wiring layer in a substrate potential supply region can be distributed to the signal wiring. As a result, a chip-area reduction effect can be obtained.

In addition, according to the first exemplary embodiment, as can be clear from the above description, local wiring 3 extending in the vertical direction is directly in contact with impurity diffused region 4, so that local wiring 3 and impurity diffused region 4 are in contact with each other all over their contact points. Thus, compared with the case where they are connected through the contact hole, a large connection area can be provided, so that an area-efficient layout structure can be provided.

In addition, one contact hole 2 is provided in a connection point between one potential supply wiring 1 and one local wiring 3 in FIG. 1A, but two or more contact holes may be provided there.

Furthermore, according to the first exemplary embodiment described with reference to FIG. 1A, impurity diffused regions 4 are separately formed in each cell row, but instead of being separately formed as impurity diffused region 4b and impurity diffused region 4c, one impurity diffused region may be formed.

Variation of First Exemplary Embodiment

Figure 2:
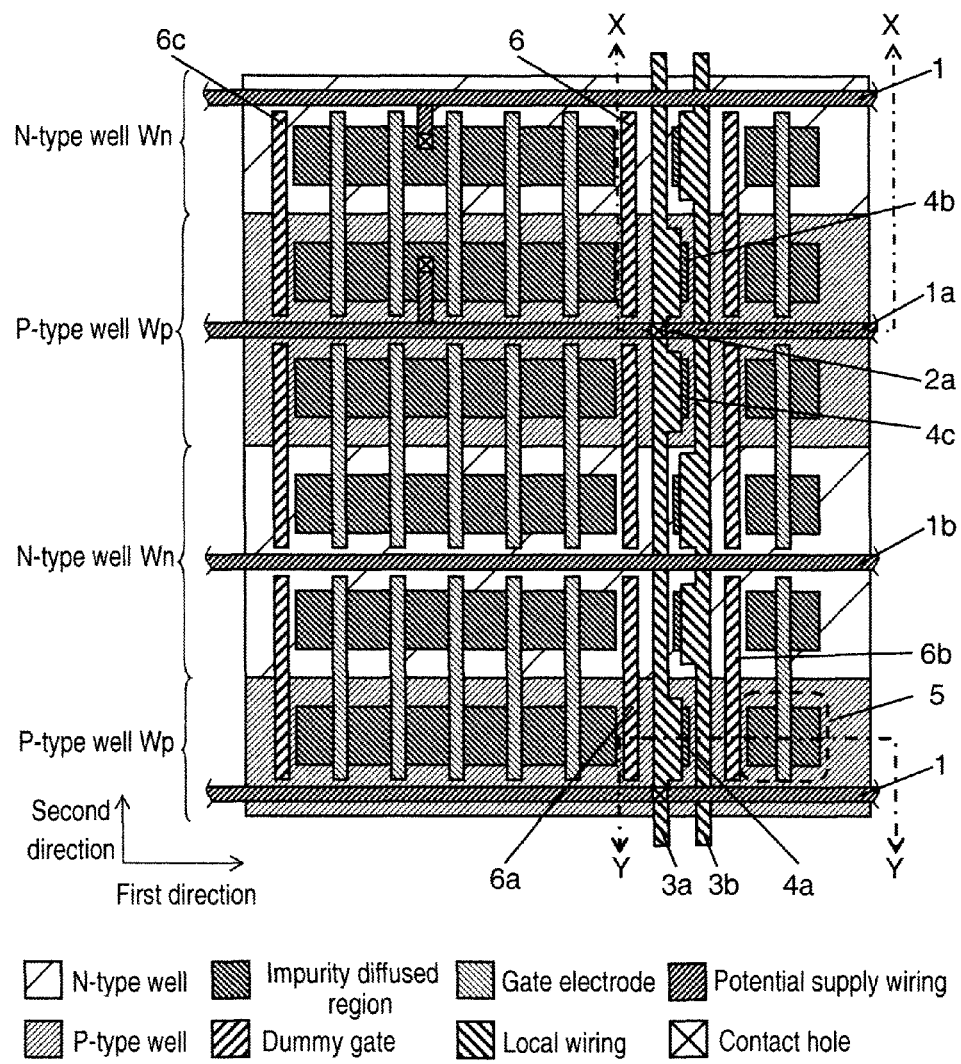
FIG. 2 is a plan view showing a layout structure of a semiconductor device according to a variation of the first exemplary embodiment.

Next, a variation of the first exemplary embodiment will be described with reference to FIG. 2. FIG. 2 is a plan view showing a layout structure of a semiconductor device according to the variation of the first exemplary embodiment. In addition, as for a component similar to that in the first exemplary embodiment described with reference to FIGS. 1A to 1C, the component is marked with the same reference and its description is omitted.

This variation differs from the first exemplary embodiment described with reference to FIGS. 1A to 1C in that there is no contact hole 2 for connecting local wiring 3b to potential supply wiring 1, and no contact hole 2b for connecting local wiring 3b to potential supply wiring 1b.

According to this variation, potential supply wirings 1 and 1a supply the potential to local wiring 3a, but potential supply wirings 1 and 1b do not supply the potential to local wiring 3b.

This variation of the first exemplary embodiment also has the same effect as that in the first exemplary embodiment.

Second Exemplary Embodiment

Figure 3A:
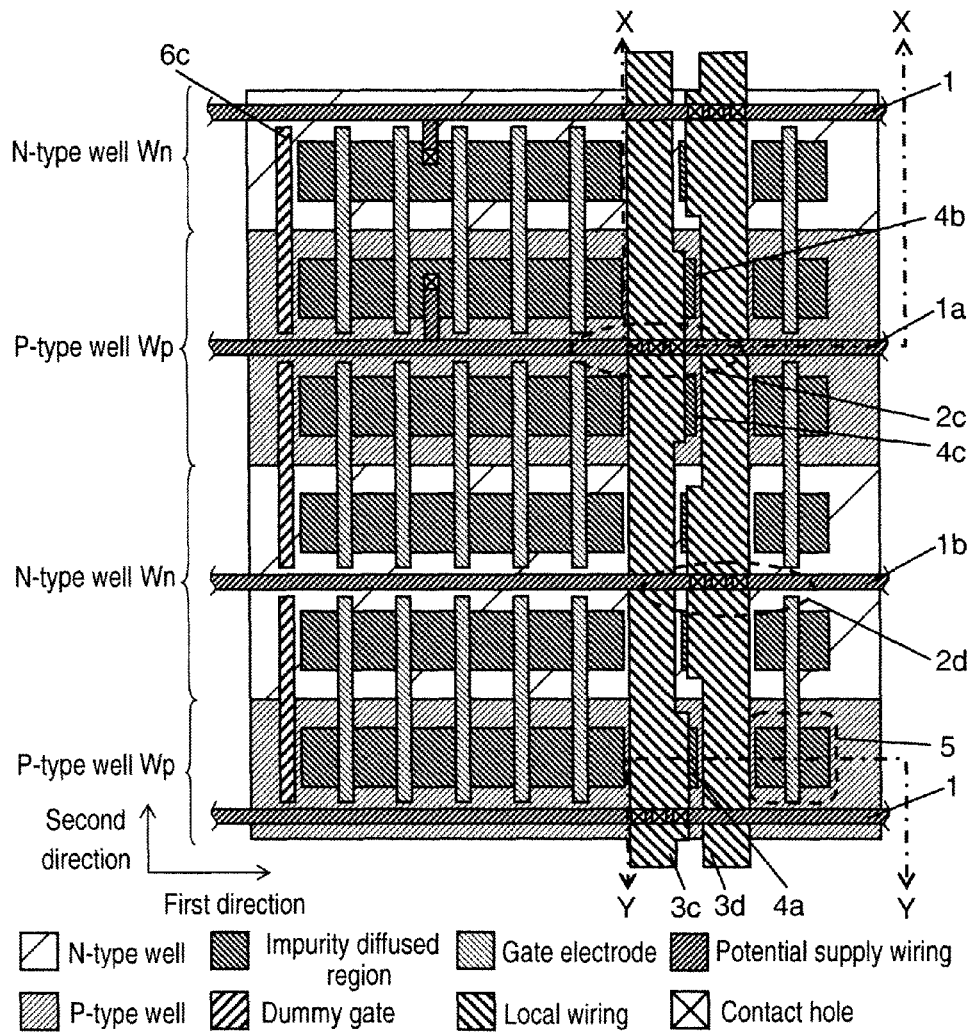
FIG. 3A is a plan view showing a layout structure of a semiconductor device according to a second exemplary embodiment.
Figure 3B:
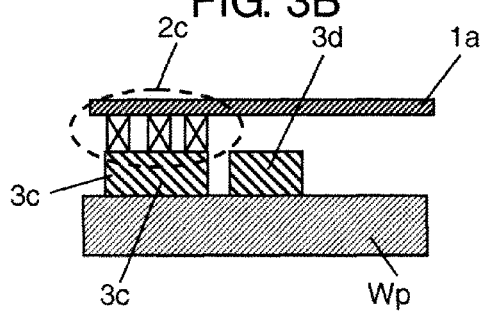
FIG. 3B is a cross-sectional view taken along a line X-X in FIG. 3A.
Figure 3C:
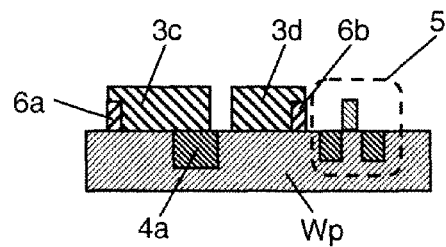
FIG. 3C is a cross-sectional view taken along a line Y-Y in FIG. 3A.

Next, the second exemplary embodiment will be described with reference to the drawings. FIGS. 3A to 3C are views each showing a structure of a semiconductor device according to the second exemplary embodiment. FIG. 3A is a plan view showing a layout structure, FIG. 3B is a cross-sectional view taken along a line X-X in FIG. 3A, and FIG. 3C is a cross-sectional view taken along a line Y-Y in FIG. 3A. In addition, as for a component similar to that in the first exemplary embodiment described with reference to FIG. 1, the component is marked with the same reference and its description is omitted.

This exemplary embodiment differs from the first exemplary embodiment described with reference to FIG. 1 in that wiring widths of local wirings 3c and 3d are larger than the wiring widths of local wirings 3a and 3b, respectively. In addition, as shown in FIG. 3C, local wirings 3c and 3d overlap with dummy gates 6a and 6b, respectively. Dummy gate 6 has no function in a circuit operation, so that there is no problem even when it is electrically connected to local wirings 3c and 3d.

The second exemplary embodiment also has the same effect as that in the first exemplary embodiment. According to this configuration, in addition to the effect in the first exemplary embodiment, wiring resistance can be reduced because the wiring width is large. As a result, it is possible to prevent IR-drop, and improve circuit performance.

Furthermore, according to this exemplary embodiment, since the wiring widths of local wirings 3c and 3d are large, local wiring 3 is connected to potential supply wiring 1 through three contact holes 2c, but local wiring 3c may be connected to potential supply wiring 1a through the one contact hole similar to the first exemplary embodiment.

Third Exemplary Embodiment

Next, the third exemplary embodiment will be described with reference to the drawings. FIGS. 4A to 4C are views each showing a structure of a semiconductor device according to the third exemplary embodiment. FIG. 4A is a plan view showing a layout structure, FIG. 4B is a cross-sectional view taken along a line X-X in FIG. 4A, and FIG. 4C is a cross-sectional view taken along a line Y-Y in FIG. 4A. In addition, as for a component similar to that in the first exemplary embodiment described with reference to FIGS. 1A to 1C, the component is marked with the same reference and its description is omitted.

This exemplary embodiment differs from the first exemplary embodiment described with reference to FIGS. 1A to 1C in that while the wiring widths of local wirings 3a and 3c are partially enlarged in the first exemplary embodiment, local wirings 3e and 3f both have a constant wiring width of W1 in the third exemplary embodiment shown in FIGS. 4A to 4C. In addition, this exemplary embodiment differs from the first exemplary embodiment in that impurity diffused region 4 is formed just under local wiring 3.

According to this exemplary embodiment, the wiring width of local wiring 3 is constant, and there is no difference in width. Thus, according to this exemplary embodiment, compared with the first exemplary embodiment and the second exemplary embodiment in which the wiring width of local wiring 3 is partially differentiated, it is possible to manufacture the semiconductor device as designed and improve a yield, in addition to obtaining the same effect as that in the first exemplary embodiment.

Fourth Exemplary Embodiment

Figure 5A:
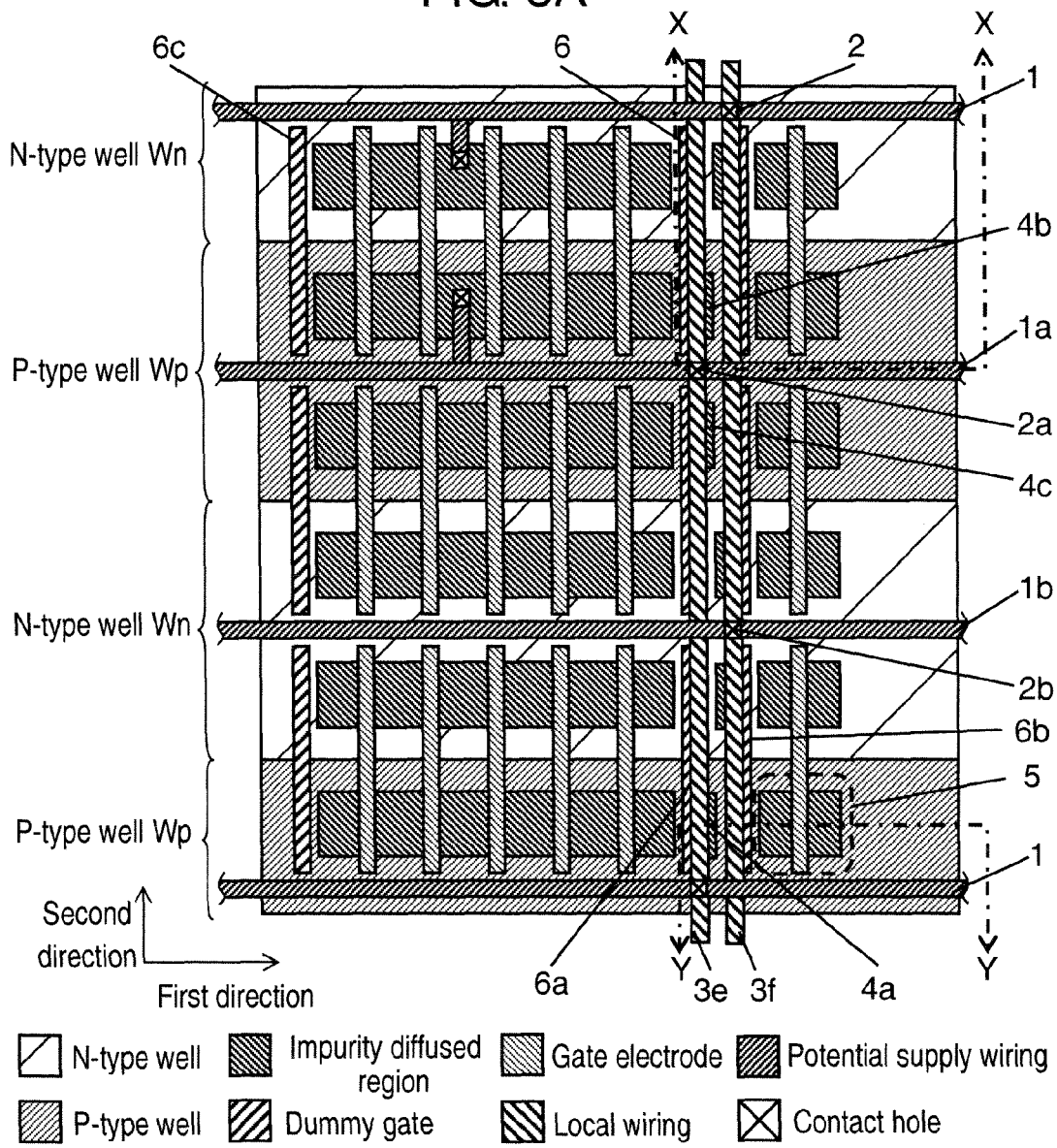
FIG. 5A is a plan view showing a layout structure of a semiconductor device according to a fourth exemplary embodiment.
Figure 5B:
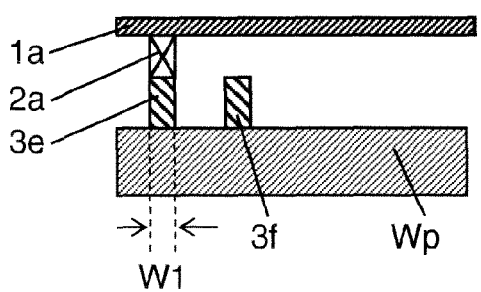
FIG. 5B is a cross-sectional view taken along a line X-X in FIG. 5A.
Figure 5C:
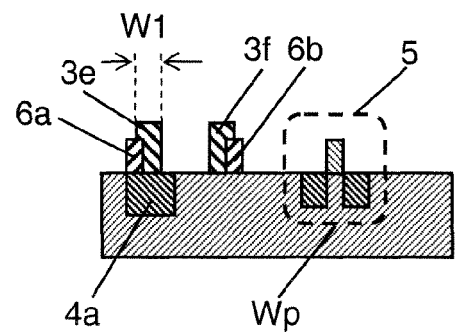
FIG. 5C is a cross-sectional view taken along a line Y-Y in FIG. 5A.

Next, the fourth exemplary embodiment will be described with reference to the drawings. FIGS. 5A to 5C are views each showing a structure of a semiconductor device according to the fourth exemplary embodiment. FIG. 5A is a plan view showing a layout structure, FIG. 5B is a cross-sectional view taken along a line X-X in FIG. 5A, and FIG. 5C is a cross-sectional view taken along a line Y-Y in FIG. 5A. In addition, as for a component similar to that in the third exemplary embodiment described with reference to FIGS. 4A to 4C, the component is marked with the same reference and its description is omitted.

The fourth exemplary embodiment differs from the third exemplary embodiment described with reference to FIGS. 4A to 4C in that while impurity diffused region 4a is not arranged under dummy gate 6a in the third exemplary embodiment, impurity diffused region 4a is arranged under dummy gate 6a in the fourth embodiment. Furthermore, according to the fourth exemplary embodiment, local wiring 3e is formed on dummy gate 6a so as to partially overlap with it, and local wiring 3f is formed on dummy gate 6b so as to partially overlap with it. According to the configuration of the conventional semiconductor device, the substrate potential is supplied from the metal wiring to the impurity diffused region through the contact hole, but according to this exemplary embodiment, since local wiring 3 is directly in contact with the impurity diffused region, dummy gate 6 can be arranged under local wiring 3. Conventionally, it has been difficult to overlap the contact hole with the dummy gate, but according to the configuration in this exemplary embodiment, since local wiring 3 is used, dummy gate 6 can be provided on impurity diffused region 4. As a result, a chip area can be reduced.

In addition, according to the fourth exemplary embodiment, the same effect as that in the first exemplary embodiment can be also obtained.

Fifth Exemplary Embodiment

Next, the fifth exemplary embodiment will be described with reference to the drawings.

Figure 6A:
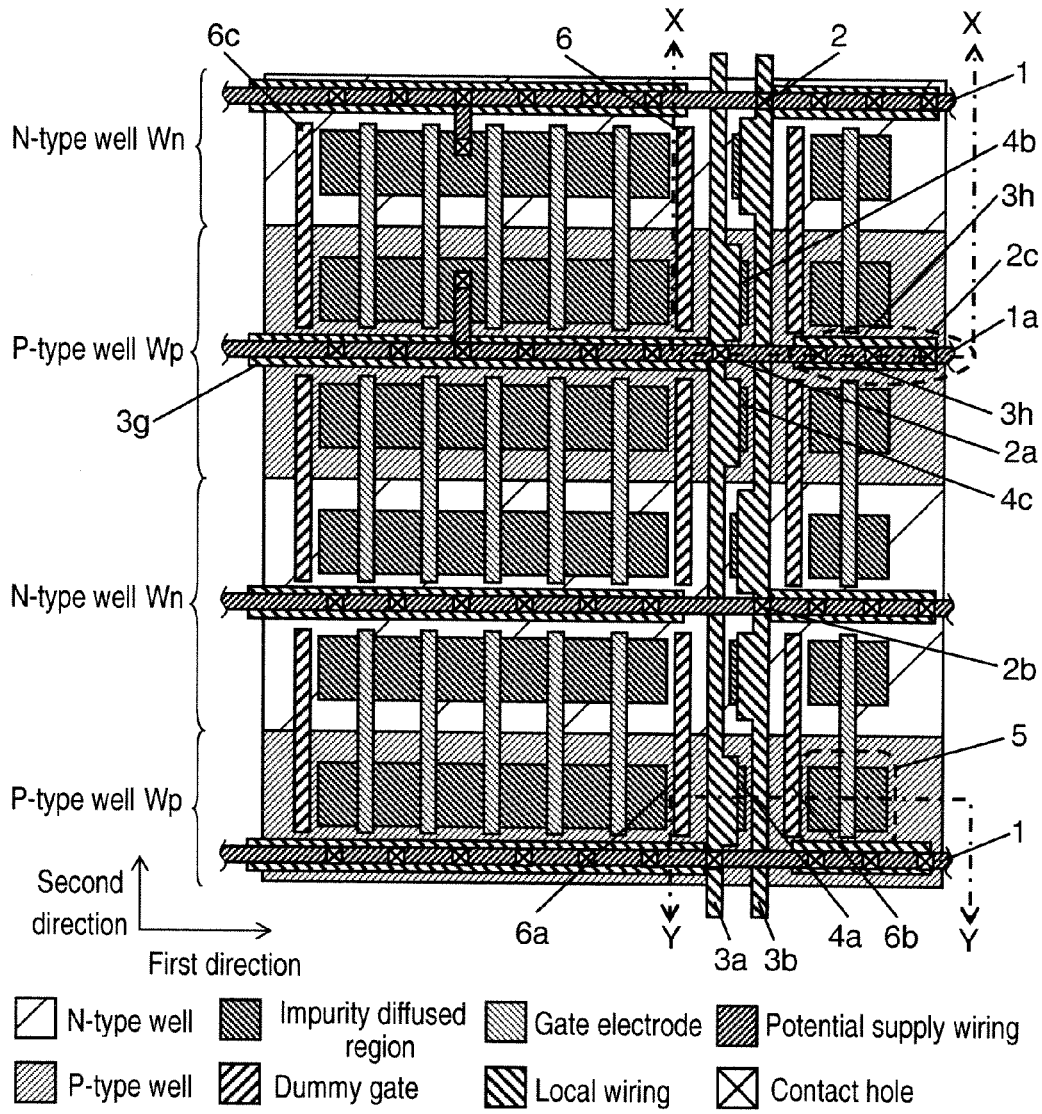
FIG. 6A is a plan view showing a layout structure of a semiconductor device according to a fifth exemplary embodiment.
Figure 6B:
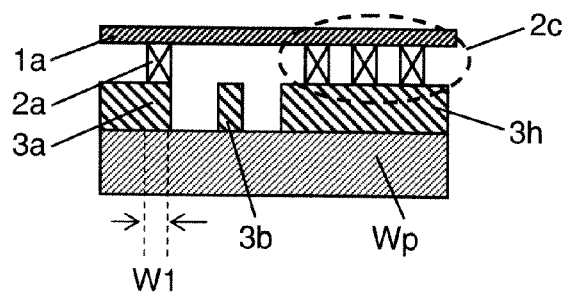
FIG. 6B is a cross-sectional view taken along a line X-X in FIG. 6A.

FIGS. 6A and 6B are views each showing a structure of a semiconductor device according to the fifth exemplary embodiment. FIG. 6A is a plan view showing a layout structure, and FIG. 6B is a cross-sectional view taken along a line X-X in FIG. 6A. In addition, as for a component similar to that in the first exemplary embodiment described with reference to FIGS. 1A to 1C, the component is marked with the same reference and its description is omitted.

This exemplary embodiment differs from the first exemplary embodiment described with reference to FIGS. 1A to 1C in that while local wiring 3 extends in the vertical direction only in the first exemplary embodiment, local wiring 3 extends also in the horizontal direction (second direction) in the fifth exemplary embodiment. As shown in FIG. 6B, local wiring 3h extends in the horizontal direction and overlaps with potential supply wiring 1a in planar view, and local wiring 3 is connected to potential supply wiring 1a through contact holes 2c. That is, local wiring 3 and potential supply wiring 1 running in parallel are lined with the contact holes.

According to this exemplary embodiment, the following effect can be obtained in addition to the same effect as that in the first exemplary embodiment. Since the potential supply wiring and the local wiring can be connected through the many contact holes, this exemplary embodiment has effects of being hardly affected by characteristics of a power supply structure in which a contact hole is defectively formed, and being resistant to electronic migration and instantaneous current.

Furthermore, according to the first to fifth exemplary embodiments, the potential is surely supplied from one of the two local wirings arranged in parallel, to all of the wells, but it is not always necessary to supply the potential from the two local wirings arranged in parallel, to all of the wells.

Furthermore, according to the first to fifth exemplary embodiments, the two local wirings are formed adjacently as one pair of wirings, but the local wirings are not necessarily one pair, and only one local wiring may be provided.

INDUSTRIAL APPLICABILITY

The semiconductor device according to the present disclosure can improve a resource of a signal wiring, and ensure more substrate contact regions without increasing an area.

What is claimed is:

1. A semiconductor device comprising:
   a plurality of first conductivity type regions extending in a first direction, and a plurality of second conductivity type regions extending in the first direction, the plurality of first conductivity type regions and the plurality of second conductivity type regions being arranged such that the plurality of first conductivity type regions and the plurality of second conductivity type regions are alternately arranged in a second direction perpendicular to the first direction;
   a plurality of first impurity diffused regions formed in the plurality of first conductivity type regions;
   a first local wiring in direct contact with the plurality of first impurity diffused regions, and extending in the second direction above the plurality of first conductive type regions and the plurality of second conductive type regions;
   a first potential supply wiring formed above the first local wiring, and extending in the first direction; and
   a first contact hole for connecting the first local wiring to the first potential supply wiring.

2. The semiconductor device according to claim 1, further comprising:
   a plurality of second impurity diffused regions formed in the plurality of second conductivity type regions;
   a second local wiring in direct contact with the plurality of second impurity diffused regions, and extending in the second direction above the plurality of first conductive type regions and the plurality of second conductive type regions;
   a second potential supply wiring formed above the second local wiring, and extending in the first direction; and
   a second contact hole for connecting the second local wiring to the second potential supply wiring.

3. The semiconductor device according to claim 1, wherein:
   a plurality of transistors are formed in the plurality of first conductivity type regions, and
   the first local wiring supplies a potential to a substrate of the plurality of transistors through the plurality of first impurity diffused regions.

4. The semiconductor device according to claim 1, further comprising:
   a dummy gate extending in the second direction and formed on the plurality of first conductivity type regions, wherein
   the first local wiring is in contact with the dummy gate.

5. The semiconductor device according to claim 1, further comprising:
   a dummy gate extending in the second direction and formed on the plurality of first conductivity type regions, wherein the dummy gate overlaps with the plurality of first impurity diffused regions in at least one portion in planar view.

6. The semiconductor device according to claim 1, wherein the first potential supply wiring is arranged above the plurality of first conductivity type regions.

7. The semiconductor device according to claim 1, wherein the first local wiring is formed by a single conductive layer.

8. The semiconductor device according to claim 2, wherein the first local wiring is separated from the plurality of second impurity diffused regions.

9. A semiconductor device comprising:
   a plurality of first conductivity type regions extending in a first direction, and a plurality of second conductivity type regions extending in the first direction, the plurality of first conductivity type regions and the plurality of second conductivity type regions being arranged such that the plurality of first conductivity type regions and the plurality of second conductivity type regions are alternately arranged in a second direction perpendicular to the first direction;
   a plurality of first impurity diffused regions formed in the plurality of first conductivity type regions;
   a first local wiring connected to the plurality of first impurity diffused regions, and extending in the second direction;
   a first potential supply wiring formed above the first local wiring, and extending in the first direction; and
   a first contact hole for connecting the first local wiring to the first potential supply wiring, wherein:
   the first local wiring has at least two wiring widths in the first direction, and
   one of the two wiring widths is larger in a region overlapping with the plurality of first impurity diffused regions than other one of the two wiring widths.

10. The semiconductor device according to claim 9, further comprising:
    a plurality of second impurity diffused regions formed in the plurality of second conductivity type regions;
    a second local wiring in direct contact with the plurality of second impurity diffused regions, and extending in the second direction;
    a second potential supply wiring formed above the second local wiring, and extending in the first direction; and
    a second contact hole for connecting the second local wiring to the second potential supply wiring.

11. The semiconductor device according to claim 9, wherein:
    a plurality of transistors are formed in the plurality of first conductivity type regions, and
    the first local wiring supplies a potential to a substrate of the plurality of transistors through the plurality of first impurity diffused regions.

12. The semiconductor device according to claim 9, further comprising:
    a dummy gate extending in the second direction and formed on the plurality of first conductivity type regions, wherein
    the first local wiring is in contact with the dummy gate.

13. The semiconductor device according to claim 9, further comprising:
    a dummy gate extending in the second direction and formed on the plurality of first conductivity type regions, wherein
    the dummy gate overlaps with the plurality of first impurity diffused regions in at least one portion in planar view.

14. The semiconductor device according to claim 9, wherein
    the first potential supply wiring is arranged above the plurality of first conductivity type regions.

15. The semiconductor device according to claim 10, wherein
    the first local wiring is separated from the plurality of second impurity diffused regions.

16. A semiconductor device comprising:
    a plurality of first conductivity type regions extending in a first direction, and a plurality of second conductivity type regions extending in the first direction, the plurality of first conductivity type regions and the plurality of second conductivity type regions being arranged such that the plurality of first conductivity type regions and the plurality of second conductivity type regions are alternately arranged in a second direction perpendicular to the first direction;

a plurality of first impurity diffused regions formed in the plurality of first conductivity type regions;

a first local wiring connected to the plurality of first impurity diffused regions, and extending in the second direction;

a first potential supply wiring formed above the first local wiring, and extending in the first direction;

a first contact hole for connecting the first local wiring to the first potential supply wiring; and a dummy gate extending in the second direction and formed on the plurality of first conductivity type regions, wherein the plurality of first impurity diffused regions is in contact with the dummy gate.

17. The semiconductor device according to claim 16, further comprising:

a plurality of second impurity diffused regions formed in the plurality of second conductivity type regions;

a second local wiring in direct contact with the plurality of second impurity diffused regions, and extending in the second direction;

a second potential supply wiring formed above the second local wiring, and extending in the first direction;

and a second contact hole for connecting the second local wiring to the second potential supply wiring.

18. The semiconductor device according to claim 16, wherein:

a plurality of transistors are formed in the plurality of first conductivity type regions, and the first local wiring supplies a potential to a substrate of the plurality of transistors through the plurality of first impurity diffused regions.

19. The semiconductor device according to claim 16, wherein the first potential supply wiring is arranged above the plurality of first conductivity type regions.

20. The semiconductor device according to claim 17, wherein the first local wiring is separated from the plurality of second impurity diffused regions.

* * * * *